(12) United States Patent
Tai et al.

(10) Patent No.: US 10,817,712 B2
(45) Date of Patent: Oct. 27, 2020

(54) GESTURE RECOGNITION METHOD AND GESTURE RECOGNITION SYSTEM

(71) Applicant: KaiKuTek Inc., Taipei (TW)

(72) Inventors: Tsung-Ming Tai, New Taipei (TW); Yun-Jie Jhang, Taoyuan (TW); Wen-Jyi Hwang, Taipei (TW); Chun-Hsuan Kuo, San Diego, CA (US)

(73) Assignee: KaiKuTek Inc., Taipei (TW)

( * ) Notice: Subject to any disclaimer, the term of this patent is extended or adjusted under 35 U.S.C. 154(b) by 237 days.

(21) Appl. No.: 16/118,398

(22) Filed: Aug. 30, 2018

(65) Prior Publication Data

US 2019/0242974 A1    Aug. 8, 2019

Related U.S. Application Data

(60) Provisional application No. 62/626,147, filed on Feb. 4, 2018.

(51) Int. Cl.
*G06K 9/00* (2006.01)
*G06K 9/62* (2006.01)
(Continued)

(52) U.S. Cl.
CPC .......... *G06K 9/00335* (2013.01); *G01S 7/414* (2013.01); *G01S 7/417* (2013.01); *G01S 13/584* (2013.01); *G01S 13/89* (2013.01); *G06F 3/017* (2013.01); *G06F 9/5027* (2013.01); *G06F 17/18* (2013.01); *G06K 9/2018* (2013.01);
(Continued)

(58) Field of Classification Search
CPC .. G01S 13/584; G01S 13/89; G01S 2007/356; G01S 7/414; G01S 7/417; G01S 13/50;
G01S 7/415; G06F 17/18; G06F 3/017; G06F 9/5027; G06K 9/00335; G06K 9/6215; G06K 9/6256; G06K 9/6259; G06K 9/6262; G06K 9/6267; G06K 9/2018; G06K 9/4628; G06K 9/6271; G06N 20/00; G06N 3/08; G06N 3/0445; G06N 3/0454; G06T 2207/10028; G06T 2207/20056;
(Continued)

(56) References Cited

U.S. PATENT DOCUMENTS

| | | | |
|---|---|---|---|
| 10,705,185 B1* | 7/2020 | Lien | G01S 7/4004 |
| 2015/0346893 A1* | 12/2015 | Schevin | G06F 3/0488 345/174 |
| 2020/0125180 A1* | 4/2020 | Malysa | G06F 3/03 |

* cited by examiner

*Primary Examiner* — Timothy X Pham
(74) *Attorney, Agent, or Firm* — Hershkovitz & Associates, PLLC; Abe Hershkovitz

(57) ABSTRACT

A gesture recognition system executes a gesture recognition method. The gesture recognition method includes steps of: receiving a training signal; selecting one of the sensing frames of the sensing signal; generating a sensing map; selecting a cell having the max-amplitude; determining a frame amplitude, a frame phase, and a frame range of the selected one of the sensing frames; setting the frame amplitudes, the frame phases, and the frame ranges of all of the sensing frames to input data of a neural network to classify a gesture event. The present invention just uses a few data to be the input data of the neural network. Therefore, the neural network may not require high computational complexity, the gesture recognition system may decrease the calculation load of the processing unit, and the gesture recognition function may not influence a normal operation of a smart device.

12 Claims, 4 Drawing Sheets

(51) Int. Cl.
    *G01S 13/89*     (2006.01)
    *G01S 7/41*      (2006.01)
    *G01S 13/58*     (2006.01)
    *G01S 13/50*     (2006.01)
    *G06K 9/20*      (2006.01)
    *G06K 9/46*      (2006.01)
    *G06N 20/00*     (2019.01)
    *G06F 3/01*      (2006.01)
    *G06F 9/50*      (2006.01)
    *G06N 3/08*      (2006.01)
    *H03B 21/02*     (2006.01)
    *G06T 7/20*      (2017.01)
    *G06F 17/18*     (2006.01)
    *G01S 7/35*      (2006.01)

(52) U.S. Cl.
    CPC ......... *G06K 9/4628* (2013.01); *G06K 9/6215* (2013.01); *G06K 9/6256* (2013.01); *G06K 9/6259* (2013.01); *G06K 9/6262* (2013.01); *G06K 9/6267* (2013.01); *G06K 9/6271* (2013.01); *G06N 3/08* (2013.01); *G06N 20/00* (2019.01); *G06T 7/20* (2013.01); *H03B 21/02* (2013.01); *G01S 7/415* (2013.01); *G01S 13/50* (2013.01); *G01S 2007/356* (2013.01); *G06T 2207/10028* (2013.01); *G06T 2207/20056* (2013.01); *G06T 2207/20081* (2013.01); *G06T 2207/20084* (2013.01)

(58) Field of Classification Search
    CPC . G06T 2207/20081; G06T 2207/20084; G06T 7/20; H03B 21/02
    See application file for complete search history.

GESTURE RECOGNITION METHOD AND GESTURE RECOGNITION SYSTEM

BACKGROUND OF THE INVENTION

1. Field of the Invention

The present invention relates to a recognition method and a recognition module, and more particularly to a gesture recognition method and a gesture recognition system.

2. Description of the Related Art

Recognition modules generally receive sensing signals from a sensor to recognize the motion of the user by using a neural network. For example, the recognition module receives sensing signals from the sensor, processes the sensing signals using the neural network, and utilizes the recognition module to determine whether a user being observed by the sensor is using portions of his or her body to do particular actions or form particular shapes, or gestures. Then, the recognition module classifies the motion of the user, and associates the motion of the user with executable commands or instructions.

One conventional gesture recognition system is a Doppler-radar based gesture recognition system. The Doppler-radar based gesture recognition system can sense a motion of a user to generate a range Doppler image, and the Doppler-radar based gesture recognition system can use all of cells of the range Doppler image to be input data of a neural network. The neural network can classify a gesture event according to the input data.

When all of the cells of the range Doppler image are used to be the input data of the neural network, the neural network may require high computational complexity. Therefore, the Doppler-radar based gesture recognition system may cause a heavy calculation load when the Doppler-radar based gesture recognition system classifies the gesture event.

The Doppler-radar based gesture recognition system may be mounted in the smart device, and the Doppler-radar based gesture recognition system can use a processor of the smart device to classify the gesture event. Then, the smart device may execute a function corresponding to the gesture event. For example, the smart device may use the gesture event to unlock the smart device.

However, a gesture recognition function is usually a sub-function of the smart device. When the gesture recognition function requires high computational complexity, the gesture recognition function may influence a normal operation of the smart device. It is the last thing that the user wants to see this happen.

Therefore, the Doppler-radar based recognition module needs to be further improved.

SUMMARY OF THE INVENTION

An objective of the present invention is to provide a gesture recognition method and a gesture recognition system. The present invention may reduce a calculation load of the gesture recognition system when a gesture event is classified.

The gesture recognition method includes a performing procedure, and the performing procedure includes steps of:
receiving a sensing signal; wherein the sensing signal includes a plurality of sensing frames;
selecting one of the sensing frames of the sensing signal;
generating a sensing map according to the selected one of the sensing frames; wherein the sensing map includes a plurality of chirps, each of the chirps includes a plurality of cells, and each of the cells has an amplitude and a phase;
selecting the cell having the max-amplitude in each of the chirps as an interested cell;
determining a frame amplitude, a frame phase, and a frame range of the selected one of the sensing frames according to the amplitudes and the phases of the interested cells of the chirps;
determining whether the frame amplitudes, the frame phases, and the frame ranges of all of the sensing frames of the sensing signal are determined;
when the frame amplitudes, the frame phases, and the frame ranges of all of the sensing frames of the sensing signal are determined, setting the frame amplitudes, the frame phases, and the frame ranges of all of the sensing frames of the sensing signal to input data of a neural network to classify a gesture event.

The gesture recognition system includes a performing module, and the performing module includes a sensing unit, a memory unit, and a processing unit.

The sensing unit receives a sensing signal, and the sensing signal includes a plurality of sensing frames.

The memory unit stores a neural network.

The processing unit is electrically connected to the sensing unit and the memory unit, and receives the sensing signal from the sensing unit. The processing unit selects one of the sensing frames of the sensing signal, and generates a sensing map according to the selected one of the sensing frames; wherein the sensing map includes a plurality of chirps, each of the chirps includes a plurality of cells, and each of the cells has an amplitude and a phase.

The processing unit selects the cell having the max-amplitude in each of the chirps as an interested cell, and determines a frame amplitude, a frame phase, and a frame range of the selected one of the sensing frames according to the amplitudes and the phases of the interested cells of the chirps.

The processing unit further determines whether the frame amplitudes, the frame phases, and the frame ranges of all of the sensing frames of the sensing signal are determined.

When the frame amplitudes, the frame phases, and the frame ranges of all of the sensing frames of the sensing signal are determined, the processing unit loads the neural network from the memory, and sets the frame amplitudes, the frame phases, and the frame ranges of all of the sensing frames of the sensing signal to input data of the neural network to classify a gesture event.

Since each of the frames just has one frame amplitude, one frame phase, and one frame range, the neural network can classify the gesture event according to a few input data. For example, when the amount of the frames is 10, the present invention may use 30 parameters to be the input data of the neural network to classify the gesture event.

Therefore, the present invention may not use parameters of the cells of the frames to be the input data of the neural network. The neural network may not require high computational complexity, the gesture recognition system may decrease the calculation load of the processing unit, and the gesture recognition function may not influence a normal operation of a smart device.

DETAILED DESCRIPTION OF THE INVENTION

Figure 1:
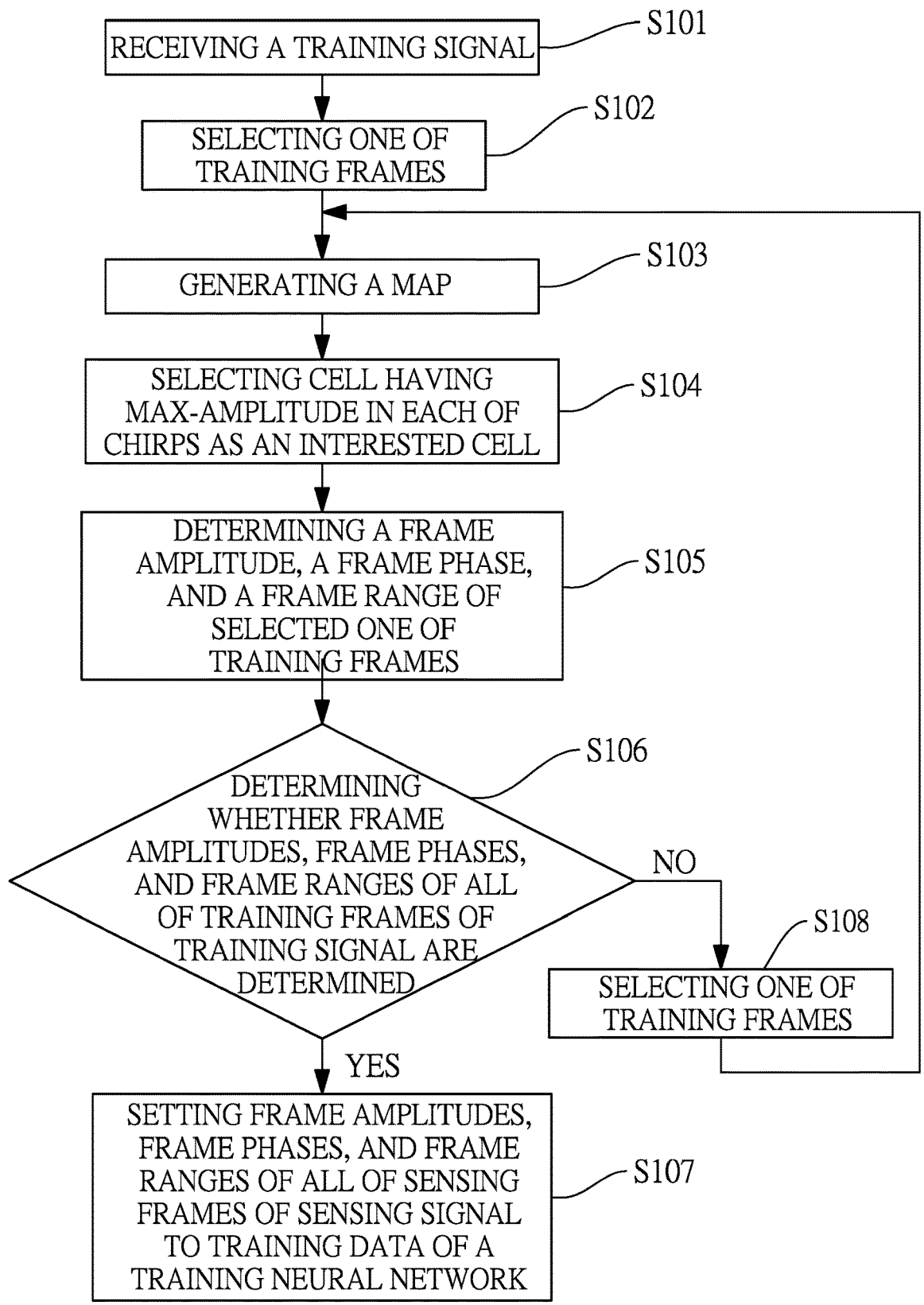
FIG. 1 is a flowchart of a first embodiment of a performing procedure of a gesture recognition method of the present invention.

With reference to FIG. 1, the present invention relates to a gesture recognition method and a gesture recognition system. The gesture recognition method includes a performing procedure, and the performing procedure includes steps of:

receiving a sensing signal; wherein the sensing signal includes a plurality of sensing frames (S101);

selecting one of the sensing frames of the sensing signal (S102);

generating a sensing map according to the selected one of the sensing frames (S103); wherein the sensing map includes a plurality of chirps, each of the chirps includes a plurality of cells, and each of the cells has an amplitude and a phase;

selecting the cell having the max-amplitude in each of the chirps as an interested cell (S104);

determining a frame amplitude, a frame phase, and a frame range of the selected one of the sensing frames according to the amplitudes and the phases of the interested cells of the chirps (S105);

determining whether the frame amplitudes, the frame phases, and the frame ranges of all of the sensing frames of the sensing signal are determined (S106);

when the frame amplitudes, the frame phases, and the frame ranges of all of the sensing frames of the sensing signal are determined, setting the frame amplitudes, the frame phases, and the frame ranges of all of the sensing frames of the sensing signal to input data of a neural network to classify a gesture event (S107).

Moreover, the gesture recognition method further includes a step of:

when the amplitude, the phase, and the range of all of the sensing frames of the sensing signal are not determined, selecting another one of the sensing frames of the sensing signal (S108), and generating the sensing map according to the selected one of the sensing frames again (S103).

Figure 2:
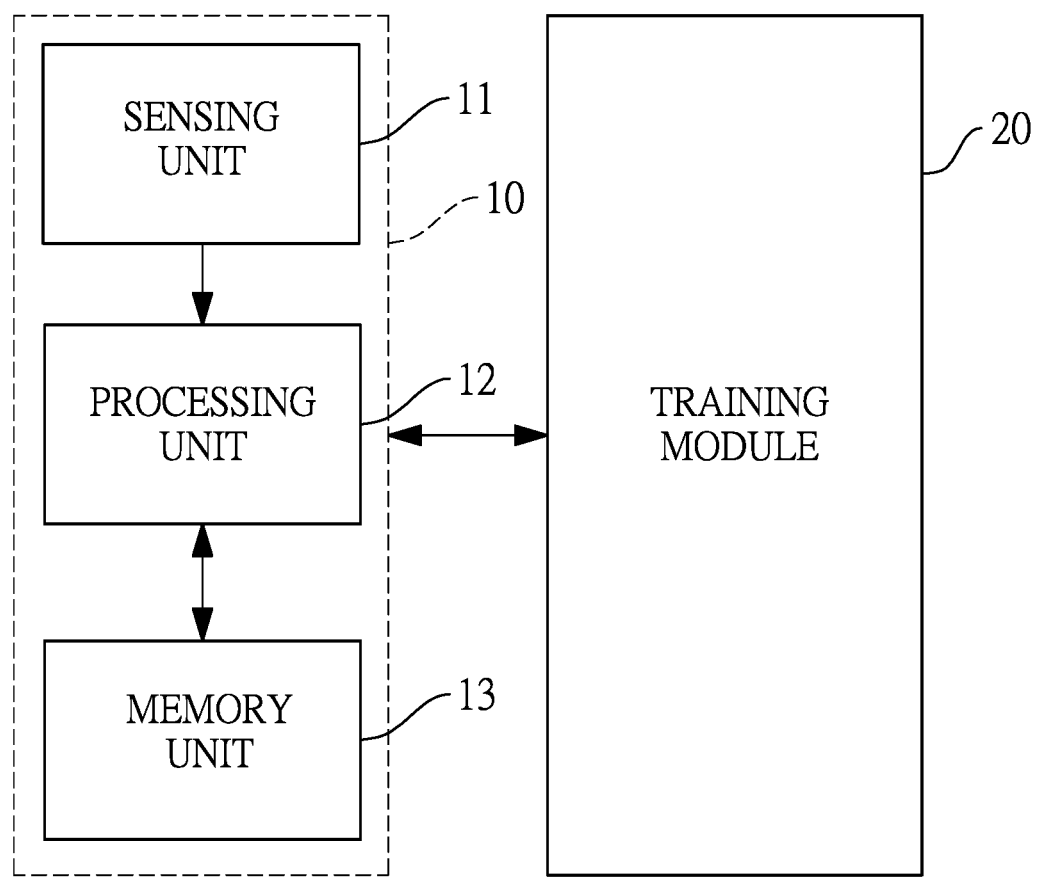
FIG. 2 is a block diagram of an embodiment of a gesture recognition system of the present invention.

With reference to FIG. 2, the gesture recognition system includes a performing module 10, and the performing module 10 includes a sensing unit 11, a processing unit 12, and a memory unit 13.

The sensing unit 11 receives a sensing signal, and the sensing signal includes a plurality of sensing frames.

The memory unit 13 stores a neural network.

The processing unit 12 is electrically connected to the sensing unit 11 and the memory unit 13, and receives the sensing signal from the sensing unit 11. The processing unit 12 selects one of the sensing frames of the sensing signal, and generates a sensing map according to the selected one of the sensing frames; wherein the sensing map includes a plurality of chirps, each of the chirps includes a plurality of cells, and each of the cells has an amplitude and a phase.

The processing unit 12 selects the cell having the max-amplitude in each of the chirps as an interested cell, and determines a frame amplitude, a frame phase, and a frame range of the selected one of the sensing frames according to the amplitudes and the phases of the interested cells of the chirps.

The processing unit 12 further determines whether the frame amplitudes, the frame phases, and the frame ranges of all of the sensing frames of the sensing signal are determined.

When the frame amplitudes, the frame phases, and the frame ranges of all of the sensing frames of the sensing signal are determined, the processing unit 12 loads the neural network from the memory 13, and sets the frame amplitudes, the frame phases, and the frame ranges of all of the sensing frames of the sensing signal to input data of the neural network to classify a gesture event.

Further, when the amplitude, the phase, and the range of all of the sensing frames of the sensing signal are not determined, the processing unit 12 selects another one of the sensing frames of the sensing signal, and generates the sensing map according to the selected one of the sensing frames again.

Since each of the frames just has one frame amplitude, one frame phase, and one frame range, the neural network can classify the gesture event according to a few input data. For example, when the amount of the frames is 10, the present invention may use 30 parameters to be the input data of the neural network to classify the gesture event.

The present invention may not use all of parameters of the cells of the frames to be the input data of the neural network. The neural network may not require high computational complexity, and the gesture recognition system of the present invention may decrease a calculation load of the processing unit 12. Therefore, when the present invention uses a central processing unit of a smart device to be the processing unit 12 of the gesture recognition system for executing the performing procedure, the gesture recognition function may not influence performance of the smart device.

Namely, the gesture recognition system may be easily integrated into the smart device, such as a smart phone, a tablet, or a computer.

Figure 3:
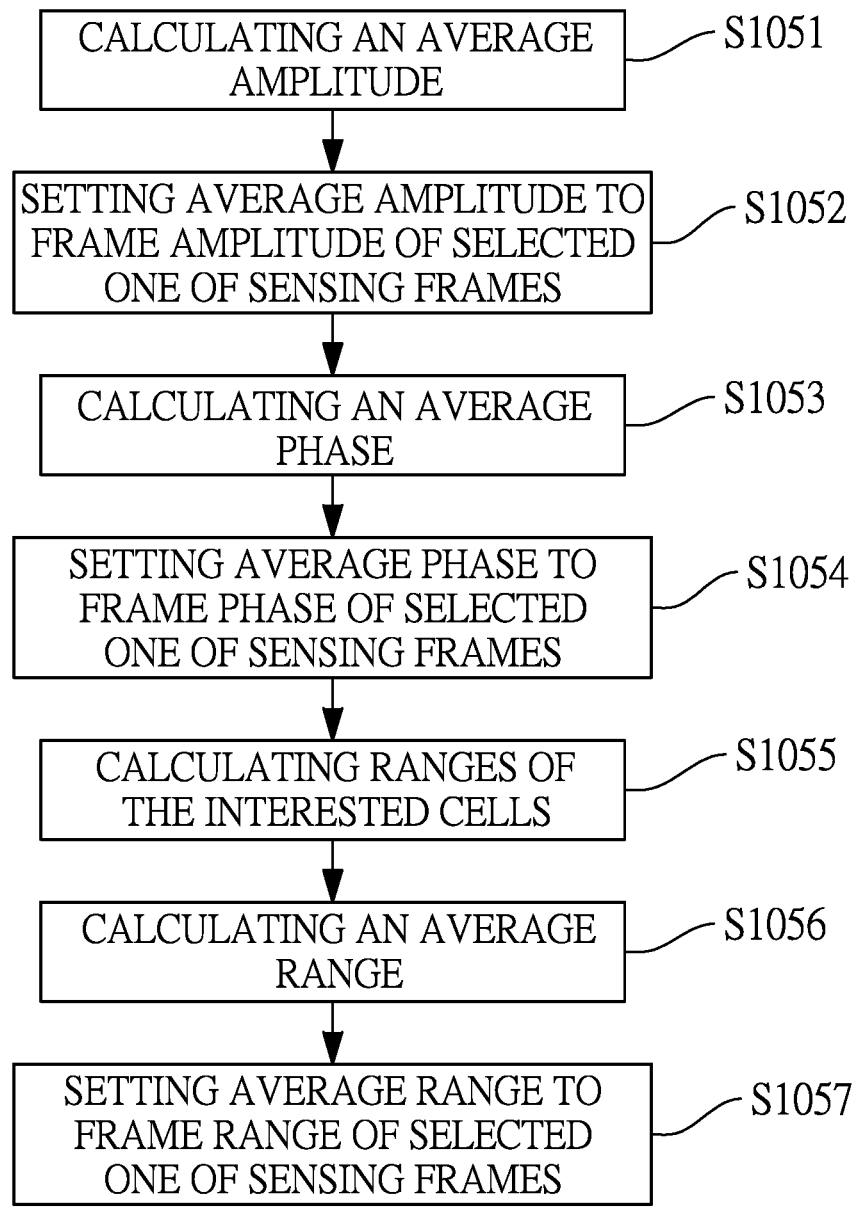
FIG. 3 is a flowchart of a second embodiment of a performing procedure of a gesture recognition method of the present invention.

Further, with reference to FIG. 3, in the amplitude, the phase, and the range the selected one of the sensing frames are determined by to the step of:

calculating an average amplitude by averaging the amplitudes of the interested cells of the chirps (S1051);

setting the average amplitude to the frame amplitude of the selected one of the sensing frames (S1052);

calculating an average phase by averaging the phases of the interested cells of the chirps (S1053);

setting the average phase to the frame phase of the selected one of the sensing frames (S1054);

calculating ranges of the interested cells according to the amplitudes of the interested cells (S1055);

calculating an average range by averaging ranges of the interested cells of the chirps (S1056);

setting the average range to the frame range of the selected one of the sensing frames (S1057).

In the embodiment, the sensing map is generated by transforming the selected one of the sensing frames using the Fast Fourier Transform (FFT), the neural network is a recurrent neural network (RNN), and the recurrent neural network is a Long Short Memory (LSTM) network, a Gated Recurrent Unit (GRU), a Simple Gated Unit (SGU), or a Minimal Gated Unit (MGU). Further, the sensing signal is a Range Doppler Image (RDI) signal.

Figure 4:
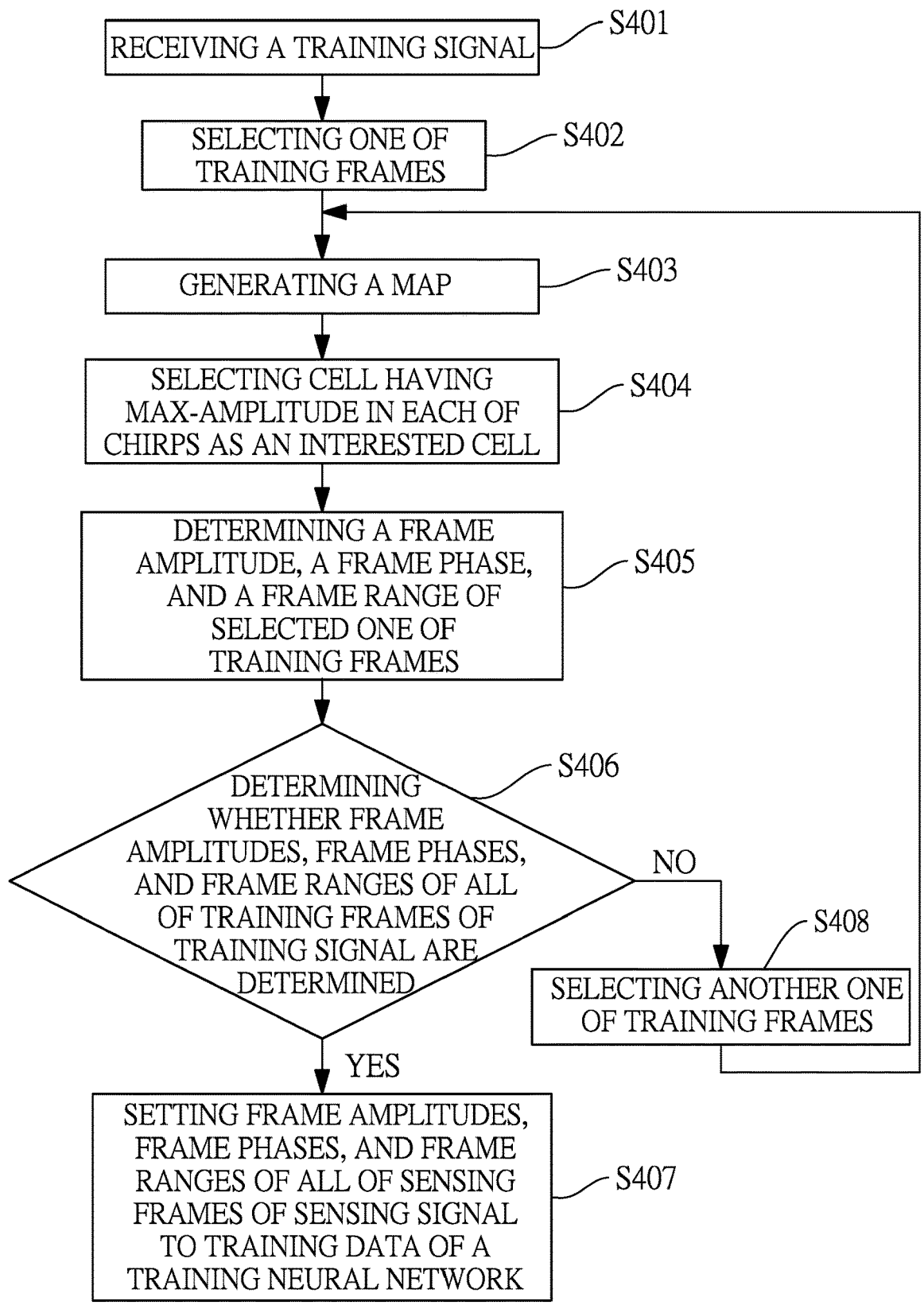
FIG. 4 is a flowchart of an embodiment of a training procedure of a gesture recognition method of the present invention.

With reference to FIG. 4, the gesture recognition method further includes a training procedure; wherein the training procedure comprises steps of:

receiving a training signal; wherein the training signal comprises a plurality of training frames (S401);

selecting one of the training frames of the training signal (S402);

generating a training map according to the selected one of the training frames (S403); wherein the training map comprises a plurality of chirps, each of the chirps comprises a plurality of cells, and each of the cells has an amplitude and a phase;

selecting the cell having the max-amplitude in each of the chirps as an interested cell (S404);

determining a frame amplitude, a frame phase, and a frame range of the selected one of the training frames according to the amplitudes and the phases of the interested cells of the chirps (S405);

determining whether the frame amplitudes, the frame phases, and the frame ranges of all of the training frames of the training signal are determined (S406);

when the frame amplitudes, the frame phases, and the frame ranges of all of the training frames of the training signal are determined, setting the frame amplitudes, the frame phases, and the frame ranges of all of the training frames of the training signal to training data of the neural network to train the neural network (S407);

when the frame amplitudes, the frame phases, and the frame ranges of all of the training frames of the training signal are not determined, selecting another one of the training frames of the training signal (S408), and generating the training map according to the selected one of the training frames again (S403).

Further with reference to FIG. 2, the gesture recognition system further includes a training module 20 to execute the training procedure described above.

For example, the training module 20 stores a training neural network, and is electrically connected to the performing module 10 to receive a training signal from the sensing unit 11 of the performing module 10. The training signal comprises a plurality of training frames.

The training module 20 selects one of the training frames of the training signal, and generates a training map according to the selected one of the training frames. The training map comprises a plurality of chirps, each of the chirps comprises a plurality of cells, and each of the cells has an amplitude and a phase.

The training module 20 selects the cell having the max-amplitude in each of the chirps as an interested cell, and determines a frame amplitude, a frame phase, and a frame range of the selected one of the training frames according to the amplitudes and the phases of the interested cells of the chirps.

The training module 20 further determines whether the frame amplitudes, the frame phases, and the frame ranges of all of the training frames of the training signal are determined;

When the frame amplitudes, the frame phases, and the frame ranges of all of the training frames of the training signal are determined, the training module 20 sets the frame amplitudes, the frame phases, and the frame ranges of all of the training frames of the training signal to training data of the training neural network to train the training neural network, and the training module 20 further updates the neural network of the performing module 10 by the training neural network.

When the frame amplitudes, the frame phases, and the frame ranges of all of the training frames of the training signal are not determined, the training module 20 selects another one of the training frames of the training signal, and generates the training map according to the selected one of the training frames again.

In the above embodiment, the training map is generated by transforming the selected one of the training frames using the Fast Fourier Transform (FFT), the training neural network of the training module 20 is a recurrent neural network (RNN), and the recurrent neural network is a Long Short Memory (LSTM) network, a Gated Recurrent Unit (GRU), a Simple Gated Unit (SGU), or a Minimal Gated Unit (MGU). Further, the training signal is a Range Doppler Image (RDI) signal.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A gesture recognition method, comprising a performing procedure; wherein the performing procedure is executed by a central processing unit of a smart device, and comprises:

receiving a sensing signal; wherein the sensing signal comprises a plurality of sensing frames; wherein the sensing signal is a Range Doppler Image (RDI) signal generated by a Doppler radar;

selecting one of the sensing frames of the sensing signal;

generating a sensing map according to the selected one of the sensing frames; wherein the sensing map comprises a plurality of chirps, each of the chirps comprises a plurality of cells, and each of the cells has an amplitude and a phase;

selecting the cell having the max-amplitude in each of the chirps as an interested cell;

determining a frame amplitude, a frame phase, and a frame range of the selected one of the sensing frames according to the amplitudes and the phases of the interested cells of the chirps;

determining whether the frame amplitudes, the frame phases, and the frame ranges of all of the sensing frames of the sensing signal are determined;

when the frame amplitudes, the frame phases, and the frame ranges of all of the sensing frames of the sensing signal are determined, setting the frame amplitudes, the frame phases, and the frame ranges of all of the sensing frames of the sensing signal to input data of a neural network to classify a gesture event.

2. The gesture recognition method as claimed in claim 1, wherein the frame amplitude, the frame phase, and the frame range the selected one of the sensing frames are determined by:

calculating an average amplitude by averaging the amplitudes of the interested cells of the chirps;

setting the average amplitude to the frame amplitude of the selected one of the sensing frames;

calculating an average phase by averaging the phases of the interested cells of the chirps;

setting the average phase to the frame phase of the selected one of the sensing frames;

calculating ranges of the interested cells according to the amplitudes of the interested cells;

calculating an average range by averaging ranges of the interested cells of the chirps; and setting the average range to the frame range of the selected one of the sensing frames.

3. The gesture recognition method as claimed in claim 1, wherein when the amplitude, the phase, and the range of all of the sensing frames of the sensing signal are not determined, selecting another one of the sensing frames of the sensing signal, and generating the sensing map according to the selected one of the sensing frames again.

4. The gesture recognition method as claimed in claim 1, wherein the sensing map is generated by transforming the selected one of the sensing frames using a Fast Fourier Transform.

5. The gesture recognition method as claimed in claim 1, wherein the neural network is a recurrent neural network (RNN).

6. The gesture recognition method as claimed in claim 5, wherein the recurrent neural network is a Long Short Memory (LSTM) network, a Gated Recurrent Unit (GRU), a Simple Gated Unit (SGU), or a Minimal Gated Unit (MGU).

7. A gesture recognition system, comprising a performing module; wherein the performing module comprises:
a sensing unit, receiving a sensing signal; wherein the sensing signal comprises a plurality of sensing frames; wherein the sensing unit is a Doppler radar, and the sensing signal is a Range Doppler Image (RDI) signal generated by the Doppler radar;
a memory unit, storing a neural network;
a processing unit, electrically connected to the sensing unit and the memory unit, and receiving the sensing signal from the sensing unit; wherein the processing unit selects one of the sensing frames of the sensing signal, and generates a sensing map according to the selected one of the sensing frames; wherein the sensing map comprises a plurality of chirps, each of the chirps comprises a plurality of cells, and each of the cells has an amplitude and a phase; wherein the processing unit is a central processing unit of a smart device;
wherein the processing unit selects the cell having the max-amplitude in each of the chirps as an interested cell, and determines a frame amplitude, a frame phase, and a frame range of the selected one of the sensing frames according to the amplitudes and the phases of the interested cells of the chirps;
wherein the processing unit further determines whether the frame amplitudes, the frame phases, and the frame ranges of all of the sensing frames of the sensing signal are determined;

wherein when the frame amplitudes, the frame phases, and the frame ranges of all of the sensing frames of the sensing signal are determined, the processing unit loads the neural network from the memory, and sets the frame amplitudes, the frame phases, and the frame ranges of all of the sensing frames of the sensing signal to input data of the neural network to classify a gesture event.

8. The gesture recognition system as claimed in claim 7, wherein the processing unit determines the frame amplitude, the frame phase, and the frame range of the selected one of the sensing frames by steps of:
calculating an average amplitude by averaging the amplitudes of the interested cells of the chirps;
setting the average amplitude to the frame amplitude of the selected one of the sensing frames;
calculating an average phase by averaging the phases of the interested cells of the chirps;
setting the average phase to the frame phase of the selected one of the sensing frames;
calculating ranges of the interested cells according to the amplitudes of the interested cells;
calculating an average range by averaging ranges of the interested cells of the chirps;
setting the average range to the frame range of the selected one of the sensing frames.

9. The gesture recognition system as claimed in claim 7, wherein when the amplitude, the phase, and the range of all of the sensing frames of the sensing signal are not determined, the processing unit selects another one of the sensing frames of the sensing signal, and generates the sensing map according to the selected one of the sensing frames again.

10. The gesture recognition system as claimed in claim 7, wherein the processing unit transforms the selected one of the sensing frames by a Fast Fourier Transform to generate the sensing map.

11. The gesture recognition system as claimed in claim 7, wherein the neural network is a recurrent neural network (RNN).

12. The gesture recognition system as claimed in claim 11, wherein the recurrent neural network is a Long Short Memory (LSTM) network, a Gated Recurrent Unit (GRU), a Simple Gated Unit (SGU), or a Minimal Gated Unit (MGU).

* * * * *